United States Patent
Robinson et al.

(10) Patent No.: US 11,194,254 B2
(45) Date of Patent: Dec. 7, 2021

(54) LITHOGRAPHY PROCESS DELAY CHARACTERIZATION AND EFFECTIVE DOSE COMPENSATION

(71) Applicant: International Business Machines Corporation, Armonk, NY (US)

(72) Inventors: Christopher Robinson, Hyde Park, NY (US); Luciana Meli, Albany, NY (US); Ekmini Anuja De Silva, Slingerlands, NY (US); Cody John Murray, Scotia, NY (US)

(73) Assignee: International Business Machines Corporation, Armonk, NY (US)

( * ) Notice: Subject to any disclaimer, the term of this patent is extended or adjusted under 35 U.S.C. 154(b) by 161 days.

(21) Appl. No.: 16/676,334

(22) Filed: Nov. 6, 2019

(65) Prior Publication Data

US 2021/0132502 A1 May 6, 2021

(51) Int. Cl.
*G03F 7/20* (2006.01)
*G03F 7/26* (2006.01)

(52) U.S. Cl.
CPC ............ *G03F 7/26* (2013.01); *G03F 7/70558* (2013.01); *G03F 7/70866* (2013.01)

(58) Field of Classification Search
CPC ........ G03F 7/26; G03F 7/705; G03F 7/70516; G03F 7/70558; G03F 7/70608; G03F 7/70866
USPC ............................ 355/35, 53, 67, 77; 430/30
See application file for complete search history.

(56) References Cited

U.S. PATENT DOCUMENTS

| | | | |
|---|---|---|---|
| 5,905,019 A | 5/1999 | Obszarny | |
| 6,773,853 B2 | 8/2004 | Minami et al. | |
| 6,879,400 B2 | 4/2005 | Ausschnitt et al. | |
| 7,229,725 B2 | 6/2007 | Yang | |
| 7,369,697 B2 | 5/2008 | Starikov | |
| 9,417,526 B2 | 8/2016 | Chun et al. | |
| 9,436,099 B2 | 9/2016 | Leewis et al. | |
| 10,274,836 B2 | 4/2019 | Corliss et al. | |
| 2001/0038964 A1* | 11/2001 | Thackeray | G03F 7/004 430/176 |
| 2003/0022097 A1* | 1/2003 | Malik | G03F 7/0392 430/270.1 |
| 2003/0152845 A1* | 8/2003 | Kumada | G03F 7/11 430/5 |

(Continued)

*Primary Examiner* — Colin W Kreutzer
(74) *Attorney, Agent, or Firm* — Abdy Raissinia; Michael J. Chang, LLC

(57) ABSTRACT

Techniques for lithography process delay characterization and effective dose compensation are provided. In one aspect, a method of analyzing a lithography process includes: applying a photoresist to a wafer; performing a post-apply bake of the photoresist; patterning the photoresist with sequences of open frame base line exposures performed at doses of from about 92% E0 to about 98% E0, and ranges therebetween, at multiple fields of the wafer separated by intervening programmed delay intervals, wherein E0 is the photoresist dose-to-clear; performing a post-exposure bake of the photoresist; developing the photoresist; performing a full wafer inspection to generate a grayscale map of the wafer; and analyzing the grayscale map to determine whether the intervening programmed delay intervals had an effect on the open frame base line exposures during the lithography process. Exposure dose compensation can then be applied to maintain a constant effective dose.

20 Claims, 6 Drawing Sheets

(56) References Cited

U.S. PATENT DOCUMENTS

| | | | |
|---|---|---|---|
| 2005/0238993 A1* | 10/2005 | Watanabe | C07D 493/08 |
| | | | 430/270.1 |
| 2006/0199100 A1* | 9/2006 | Kanda | G03F 7/0392 |
| | | | 430/270.1 |
| 2006/0204859 A1 | 9/2006 | Leidy et al. | |
| 2007/0085031 A1* | 4/2007 | Lozes | B82Y 40/00 |
| | | | 250/492.1 |
| 2018/0373164 A1 | 12/2018 | Corliss et al. | |
| 2019/0033715 A1 | 1/2019 | Adachi et al. | |

* cited by examiner

LITHOGRAPHY PROCESS DELAY CHARACTERIZATION AND EFFECTIVE DOSE COMPENSATION

FIELD OF THE INVENTION

The present invention relates to lithography analysis, and more particularly, to techniques for lithography process delay characterization and effective dose compensation.

BACKGROUND OF THE INVENTION

Extreme ultraviolet (EUV) lithography uses a range of EUV wavelengths for patterning. With EUV lithography, tight control of the effective dose delivered is particularly important for mitigating stochastic defects, which exhibit a strong dose dependence, and effectively define the process window. Stochastic defects are patterning failures such as line breaks or overlapping patterns.

In EUV lithography, the effective dose is a function of the photochemical reaction occurring in the resist in addition to the scanner supplied incident dose. Thus, it can vary significantly due to factors such as post-apply bake (PAB)-to-expose delay and especially expose to-post-expose bake (PEB) delays that result from long EUV exposure times. Most significantly, after resist is exposed to EUV radiation on the scanner, a delay can occur before the resist is baked to generate reactive acids (i.e., a PEB delay). Delays between exposure and PEB can lead to a change in developed critical dimension and yield variability. Delays can also occur before the coated resist is exposed (i.e., a PAB-to-expose delay), but for typical photoresist materials these have much less bearing on resist sensitivity.

Currently, fast, quantitative and accurate methods for understanding the material and process impacts on effective dose do not currently exist. Namely, the current practice is to run send-aheads' (i.e., pre-production test wafers) for each material stack/pitch target and analyze through critical dimension (CD) metrology and electron-beam (e-beam) inspection to understand CD and defect response. The use of send-aheads for process control is time-consuming and costly. Additionally, it is possible that send-ahead wafers may not experience the same process delays as normally sequenced product lot wafers.

Thus, techniques for analyzing lithography process timing impacts such as expose-to-PEB delays and PAB-to-expose delays, and use of that characterization for effective dose compensation would be desirable.

SUMMARY OF THE INVENTION

The present invention provides techniques for lithography process delay characterization and effective dose compensation. In one aspect of the invention, a method of analyzing a lithography process is provided. The method includes: applying a photoresist to a wafer; performing a post-apply bake of the photoresist; patterning the photoresist with sequences of open frame base line exposures performed at doses of from about 92% E0 to about 98% E0, and ranges therebetween, at multiple sets of fields of the wafer separated by intervening programmed delay intervals, wherein E0 is the photoresist dose-to-clear; performing a post-exposure bake of the photoresist; developing the photoresist; performing a full wafer inspection to generate a grayscale map of the wafer; and analyzing the grayscale map to determine whether the intervening programmed delay intervals had an effect on the open frame base line exposures during the lithography process.

In another aspect of the invention, another method of analyzing a lithography process is provided. The method includes: applying a photoresist to a wafer; performing a post-apply bake of the photoresist; patterning the photoresist with sequences of open frame base line exposures performed at doses of from about 92% E0 to about 98% E0, and ranges therebetween, at multiple sets of fields of the wafer separated by intervening programmed delay intervals performed at reserved fields of the wafer, and a sequence of open frame calibration exposures performed at incremental dose steps at calibration fields of the wafer, wherein E0 is the photoresist dose-to-clear; performing a post-exposure bake of the photoresist; developing the photoresist; performing a full wafer inspection to generate a grayscale map of the wafer; analyzing the grayscale map to determine whether the intervening programmed delay intervals had an effect on the open frame base line exposures during the lithography process; using the open frame calibration exposures performed at the incremental doses to correlate grayscale values in the grayscale map with dose for those open frame base line exposures shifted by the intervening programmed delay intervals; adjusting the dose of the base line exposures shifted by the intervening programmed delay intervals to achieve a constant effective dose across the wafer; and using a delay-dose shift correlation to devise a dose compensation to apply to product wafers.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for analyzing lithography (e.g., extreme ultraviolet (EUV) lithography) process characteristics such as expose-to-PEB and PAB-to-expose delays, and for determining any necessary dose compensation. Namely, lithography generally involves the patterning of a photosensitive resist material (or photoresist), and then transferring of the pattern to an underlying substrate. In the case of EUV lithography, patterning of the photoresist is done via a scanner using a range of EUV wavelengths of light. See, e.g., scanner 100 shown in FIG. 1.

Figure 1:
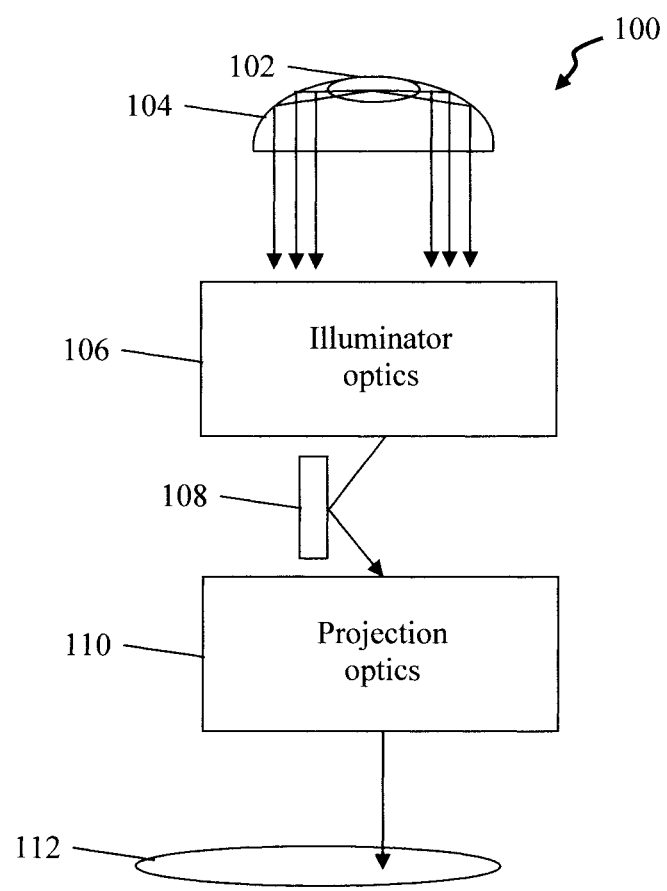
FIG. 1 is a diagram illustrating an exemplary extreme ultraviolet (EUV) scanner according to an embodiment of the present invention.

As shown in FIG. 1, EUV scanner 100 includes an EUV generating plasma source 102 and a collector 104 (reflective optics) for directing light from the source 102 toward illuminator optics 106. Generally, as is known to those of ordinary skill in the art, the illuminator optics 106 contain a series of mirrors (not shown) off of which the light is reflected in order to generate a certain pupil shape for illuminating a reflective mask 108 with the appropriate amount of light.

Mask 108 can contain a pattern having light reflecting and/or absorbing surfaces. For instance, mask 108 can have a pattern corresponding to an integrated circuit design to be printed on a photoresist-coated wafer 112. Namely, the light reflected off of the pattern in mask 108 enters projection optics 110 which projects the light, at the correct angle, onto the photoresist-coated wafer 112. Generally, as is known to those of ordinary skill in the art, projection optics 110 also contain a series of mirrors (not shown) to direct the light onto the wafer surface.

Patterning of the photoresist by EUV lithography includes an exposure step whereby the photoresist is exposed to EUV wavelengths of light modulated by the EUV mask 108 pattern. A post-exposure bake is used to amplify the exposure reaction. The photoresist is then developed to remove the exposed portions of the photoresist (for a positive photoresist) or the non-exposed portions of the photoresist (for a negative photoresist). The result is a patterned photoresist that can then be used as a mask to pattern the underlying wafer.

Ideally, the effective dose is uniform during the lithography process. However, as highlighted above, the effective dose can vary significantly due to factors such as expose-to-PEB and PAB-to expose delays. Namely, with a long exposure time, delays can occur between exposure and the resist post-exposure bake (i.e., expose-to-PEB delay) and between the resist post-apply bake and exposure (i.e., PAB-to-expose delay).

For instance, as highlighted above, exposure of the photoresist is done via an EUV scanner such as EUV scanner 100 of FIG. 1 which projects an image onto a given portion or field of the photoresist-coated wafer. The substrate is then moved relative to the system in order to systematically expose each of the fields of the wafer. See, e.g., U.S. Pat. No. 10,274,836 issued to Corliss et al., entitled "Determination of Lithography Effective Dose Uniformity" (hereinafter "U.S. Pat. No. 10,274,836"), the contents of which are incorporated by reference as if fully set forth herein.

However, semiconductor wafer exposure times of 20 minutes or more can be required on first generation EUV scanners operating near the end of their collector life due to relatively low source output power, power inefficiency in generating optimal illumination pupils for illuminating the EUV mask, and the low sensitivity of many of the best performing EUV photoresist resist materials. While sources for second and third generation EUV production scanners provide 2-3 times more output power and these scanners garner up to 2 times the additional power improvements through improved illumination pupil efficiency, higher dose EUV photoresists may still result in wafer exposure times on the order of 5 minutes or more.

The negative effects of this slow exposure include the potential for significant variability in photoresist expose-to-PEB and PAB-to-expose delays. Namely, the first field exposed on the EUV scanner could have a few minutes more expose-to-PEB compared to the last field exposed, and the last field exposed has a correspondingly longer PAB-to-expose delay. While either or both of these delays can impact the effective process dose due to changes in the resist photo-chemistry, the expose-to-PEB delay is typically more critical. Advantageously, the effective dose impacts of these expose-to-PEB and PAB-to-expose delays are characterized via the present techniques, and used to adjust the scanner applied doses accordingly.

For instance, as will be described in detail below, the present techniques enable characterization of dose sensitivity to expose-to-PEB and PAB-to-expose delays through the measurement of effective dose experienced by the wafer, and an exposure sequence designed to highlight and quantify small changes in the effective dose. Additionally, compensation for variable expose-to-PEB and PAB-to-expose delays is achieved by incrementing the nominal EUV exposure dose in small steps from the first to the last field exposed.

Figure 2:
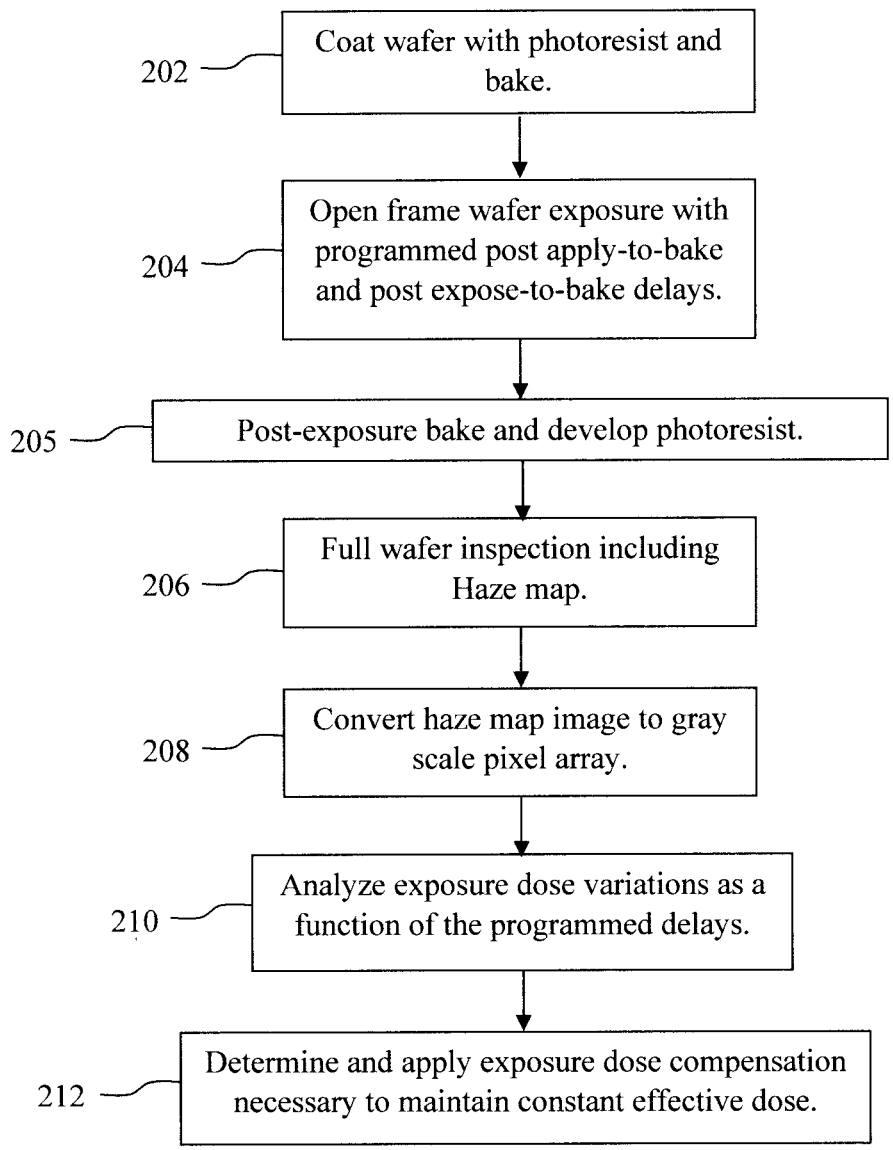
FIG. 2 is a diagram illustrating an exemplary methodology for analyzing a lithography process using programmed delay intervals and use thereof for effective dose compensation according to an embodiment of the present invention.

An exemplary methodology 200 for analyzing a lithography process performed on a wafer through delay characterization and effective dose compensation is now described by way of reference to FIG. 2. In step 202, a photoresist is applied to/coated on the wafer and baked (i.e., a post-apply bake to drive out residual solvents from the film) in accordance with standard practices. For instance, the photoresist can be a commercially-available photoresist material that is deposited onto the wafer using a casting process such as spin-coating or spray-coating. According to an exemplary embodiment, the post-apply bake is performed at a temperature of from about 80° C. to about 150° C., and ranges therebetween.

It is notable that either a positive photoresist or a negative photoresist can be coated on the wafer. As highlighted above, during development the exposed portions of a positive photoresist are removed. Conversely, the unexposed portions of a negative photoresist are removed during development. Further, it is notable that while reference is made below to the implementation of methodology 200 in conjunction with EUV scanner 100 of FIG. 1 (described above), the present techniques are more generally applicable to the characterization of any lithography process.

As highlighted above, exposure of the photoresist is generally carried out by projecting an image onto a given portion or field of the photoresist-coated wafer. This process is repeated field-by-field across the surface of the wafer.

For instance, when a positive photoresist is exposed, the exposed portions of the photoresist undergo a reaction which makes the exposed portions more soluble in a developing solution. Typically, a bake process amplifies this reaction. The exposed portions of the photoresist can then be selectively removed by contacting the photoresist with the developing solution. The degree of dissolution of the photoresist by the developing solution depends on the dosage level of the EUV radiation during exposure. Furthermore, when the photoresist is developed, the thickness of the exposed photoresist decreases. Thus, if the dosage level of the EUV radiation during exposure is less than that required for full dissolution, the residual thickness depends on the dosage of the EUV radiation.

Namely, during the development process, dissolution of the photoresist occurs through the full thickness of the photoresist when the dosage of the EUV radiation has a value, E0, known as the dose-to-clear. To look at it another way, the E0 dosage results in full dissolution and removal of the photoresist. For EUV radiation doses exceeding the dose-to-clear value E0, the photoresist is also removed, however doing so can potentially lead to surface energy changes. The net result is that residual photoresist film properties at exposure doses slightly below the E0 dose can provide a very sensitive metric of radiation dose variations, which will be leveraged herein along with programmed delays to characterize the lithographic process, thereby enabling for dosage compensations in the process to be made in order to maintain a constant effective dose.

Namely, in step 204 sequences of open frame exposures of the wafer are performed with the intervening programmed delay intervals. In accordance with the present techniques, the programmed delay intervals are designed to simulate the post apply-to-bake and post expose-to-bake delays that can occur during wafer processing. By 'open frame exposure' it is meant that exposure of the photoresist is performed without a mask pattern. For instance, in the case of EUV scanner 100, an open frame exposure can be performed using a reflective mask 108 that is fully reflective, i.e., not containing a masking pattern (also referred to herein as an "open frame mask"). In that case, the open frame mask 108 would essentially act as a mirror (with the usual absorber layer removed everywhere from the mask 108) that reflects approximately 100% of the incident EUV illumination to the wafer surface.

As will be described in detail below, the open frame exposures in step 204 are performed field-by-field across the surface of the photoresist-coated wafer with delay intervals implemented using repeated exposures, i.e., exposures that will not be used for quantifying dose variation but serve primarily to institute an intentional delay in the exposure process.

The delay intervals can be programmed into the open frame exposures in a number of different ways. For instance, in one exemplary embodiment, the repeated exposures are simply performed on select reserved fields of the wafer. See, for example, FIG. 3—described below. Repeated high dose exposure at these reserved fields of the wafer can, however, result in a significant flare dosage being received by fields adjacent to the reserved fields and excessive resist outgassing into the EUV scanner vacuum chamber.

Thus, according to another exemplary embodiment, an alternative absorbing mask is used at the reserved fields. See, for example, methodology 500 of FIG. 5—described below. In contrast to the open frame mask, the absorbing mask reflects approximately 0% of the incident EUV illumination to the wafer surface. With this alternative scheme, a couple of additional minutes of delay are advantageously achieved simply due to the mask exchanges, i.e., open frame mask→absorbing mask→open frame mask, and only a small percentage (on the order of 1%) of each repeated exposure dose is transmitted by the absorbing mask to the photoresist-coated wafer. In addition to avoiding the high resist exposure doses resulting from the cumulative repeated exposures (see above), the implementation of an absorbing mask for the delay intervals adds more overhead time to the delay for the mask exchanges (see above) as well as prevents damage to the open frame mask.

According to an exemplary embodiment, the open frame exposures performed in step 204 are performed at both a base line dose as well as at incremental doses for grayscale calibration, with the delay intervals inserted therebetween (optionally using an absorbing mask exchange). The base line dose is a dose of from about 92% of the E0 to about 98% of the E0, and ranges therebetween. As provided above, E0 is the photoresist dose-to-clear or the dosage that results in full dissolution and removal of the photoresist. Namely, what is being sought here is not the E0 dose, but an exposure dose just below the dose-to-clear that during inspection gives the most sensitive gray haze map scale response. By way of example only, according to one exemplary embodiment, a dose of about 0.96×E0 (or 4% below the E0 dose) is employed as the base line dose, i.e., the dose that provides a sensitive grayscale response.

The incremental doses are dose steps that lead to different grayscale results that are used to calibrate the grayscale (see, for example, step 206—described below). The incremental doses and their corresponding grayscale information are then used to understand what the grayscale values in other areas of the wafer correspond to in dose. According to an exemplary embodiment, the incremental dose steps are 2% increments culminating in the E0 dose (e.g., 0.82E0, 0.84E0, 0.86E0, 0.88E0, 0.90E0, 0.92E0, 0.94E0, 0.96E0, 0.98E0, 1.00E0).

Following completion of the wafer exposures with programmed delays, a post-exposure bake and development of the photoresist is performed in step 205. According to an exemplary embodiment, the post-exposure bake is performed at a temperature of from about 100° C. to about 175° C., and ranges therebetween. As described above, developing involves contacting the exposed photoresist with a developing solution to remove either the exposed portions of the photoresist (for a positive photoresist) or the unexposed portion of the photoresist (for a negative photoresist).

As highlighted above, the programmed delay intervals implemented in step 204 are designed to intentionally inter-ject expose-to-PEB and PAB-to-expose delays into methodology 200. Namely, the programmed delays inserted into the process in step 204 separate the time between the wafer exposure and post-exposure bake (steps 204 and 205) and also the time between the resist post-apply bake and exposure (steps 202 and 204).

Next, in step 206 a full surface scan of the wafer is performed generating a haze map. According to an exemplary embodiment, this full surface scan of the exposed wafer is performed using a defect inspection tool that detects and analyzes oblique light scattered from the wafer surface. A commercially-available wafer defect inspection system such as the Surf-Scan tools available from KLA-Tencor Corporation, Milpitas, Calif., can be employed in step 206 for the full surface wafer scan. Generally, this type of inspection system detects defects on wafers using light and obtains the position coordinates (XYZ) of the defects. Advantageously, this process provides high sensitivity, while allowing an analysis of a large area of the wafer.

The signal background noise detected during the defect inspection of the exposed wafer is also referred to as haze data. A XYZ haze map can then be created which represents a collection of the haze data from the full surface of the wafer. As will be described in detail below, an analysis of the high-spatial frequency surface inspection haze data derived from the scattered light background noise signal can turn the open frame exposures with programmed delay intervals into a quantitative dose assessment technique.

In step 208, the haze map is converted to a grayscale pixel array image. According to an exemplary embodiment, the defect inspection tool directly outputs a grayscale image or images of the wafer following the surface scan performed in step 206. Alternatively, a high-resolution graphical image file of the wafer is output which contains the grayscale pixel details.

Figure 3:
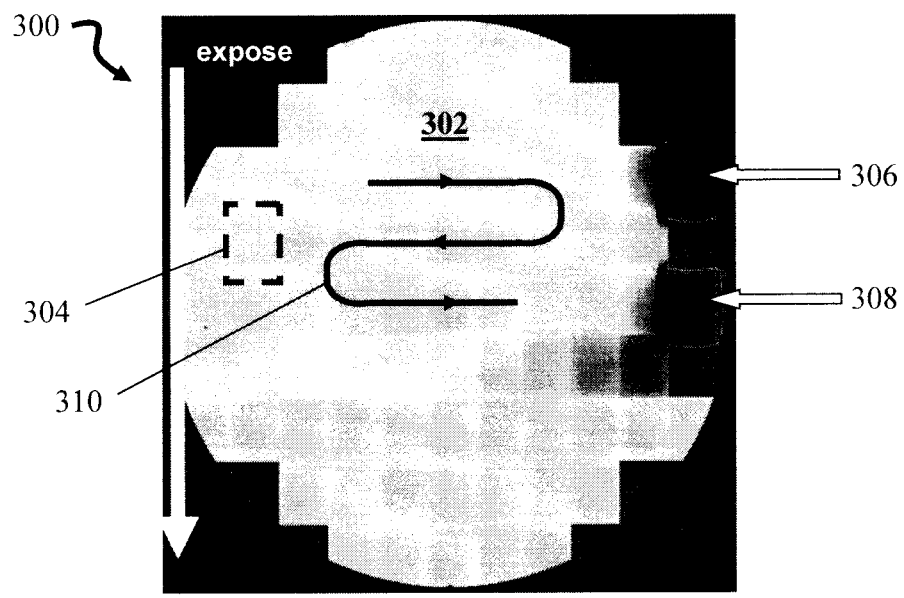
FIG. 3 is a diagram illustrating an exemplary grayscale map of a wafer according to an embodiment of the present invention.

Referring, for example, to grayscale image 300 of a photoresist-coated wafer 302 shown in FIG. 3, the surface characteristics of a particular field (such as field 304 on wafer 302) are represented in the pixel array as shades of gray. The brightness of a given field in image 300 correlates to the residual photoresist film properties such as thickness, roughness and surface energy at that field, and thus is related to the effective dose received at that point. By way of non-limiting example only, using 8 bits per pixel which provides 256 different shades of gray, the grayscale image can range from an intensity of 256 (representing E', i.e., the maximum grayscale response) to 0 (representing a dose significantly more or less than E'). It should be understood that other bit depths can be used. For instance, 10-bit graphics files could be used where 1024 different shades of gray are provided. It should also be understood that color images can be created instead of grayscale images. In such a manner, the haze map is quickly transformed from into a graphical image that can then be analyzed using any one of a number of different graphics tools.

Further, as provided above, one technique contemplated herein for programming the delay intervals into the open frame exposures is by simply performing repeated exposures on select reserved fields of the wafer. This technique is illustrated in FIG. 3. Namely, in this example, the reserved fields 306 and 308 are located at the far-right ends of rows 3 and 5, respectively. See, for example, FIG. 3—described below. Thus, repeated exposures on reserved field 306 would introduce a delay interval between the open frame exposure performed up to, and after, the far-right end of row 3. See arrow 310 indicating the scan direction. Likewise, repeated exposures on reserved field 308 would introduce a delay interval between the open frame exposure performed up to, and after, the far-right end of row 5. However, repeated high dose exposure at these reserved fields 306 and 308 of the wafer can result in a significant flare dosage being received by fields adjacent to reserved fields 306 and 308 and excessive resist outgassing which are undesirable.

Referring back to methodology 200 of FIG. 2, in step 210 the pixel array is then used to analyze the base line fields to determine whether the intervening programmed delays shifted the grayscale response. For instance, the pixel array is now a graphic file in one of a variety of different formats (for example, jpeg, png, gif, bmp, tiff, and the like), and image analysis tools such as MATLAB can be used to analyze the uniformity of the graphic file, to determine brightness (dose) variations as a function of the programmed delays.

Advantageously, quantifying the process delays in this manner enables one to then adjust the dose, if need be, in order to maintain a constant effective dose across the wafer. See step 212. Namely, as provided above, the brightness of a given field in the grayscale pixel array is related to the effective dose received at that point. Thus, a comparison can be made between the brightness of the base line fields before and after the programmed delay intervals. If a grayscale level difference is detected between the base line fields before and after the programmed delay intervals, then the calibration fields (i.e., at incremental doses) can be used to understand the dose to grayscale value correlation. Based on that information, dose adjustments can be made at given fields in order to achieve a constant grayscale brightness and thereby constant effective dose values across the wafer. Once a correlation is made between delay time and effective dose correction required for a given photoresist process (i.e., a delay-dose shift correlation) the appropriate scanner dose compensation can be applied to product wafers by using small exposure dose meander steps. For example, if ten minute expose-to-PEB delays result in an effective dose drop of 1%, then the last exposed site of a ten minute product wafer exposure would be overdosed compared to the first exposed site by 1%. The increasing effective dose can be compensated by decreasing the applied dose of each successive exposure field compared to the previous field. Scanner recipes include the capability for such site-to-site dose offsets, often referred to as dose meander steps, for use in resist characterization exposures. Instead of using dose meander steps on the order of 1% which are typical for resist characterization, negative dose steps 2 orders of magnitude smaller would be employed for exposure delay compensation. In the case cited above $-0.01$ mJ/cm$^2$ dose meander steps applied over the course of 75 exposure sites would compensate for the increasing effective dose experienced by sequentially exposed sites due to shorter expose-to-PEB delays with a net correction of $-0.75$ mJ/cm$^2$ or $-1\%$ of a nominal 75 mJcm$^2$ dose at the last exposed site.

Figure 4:
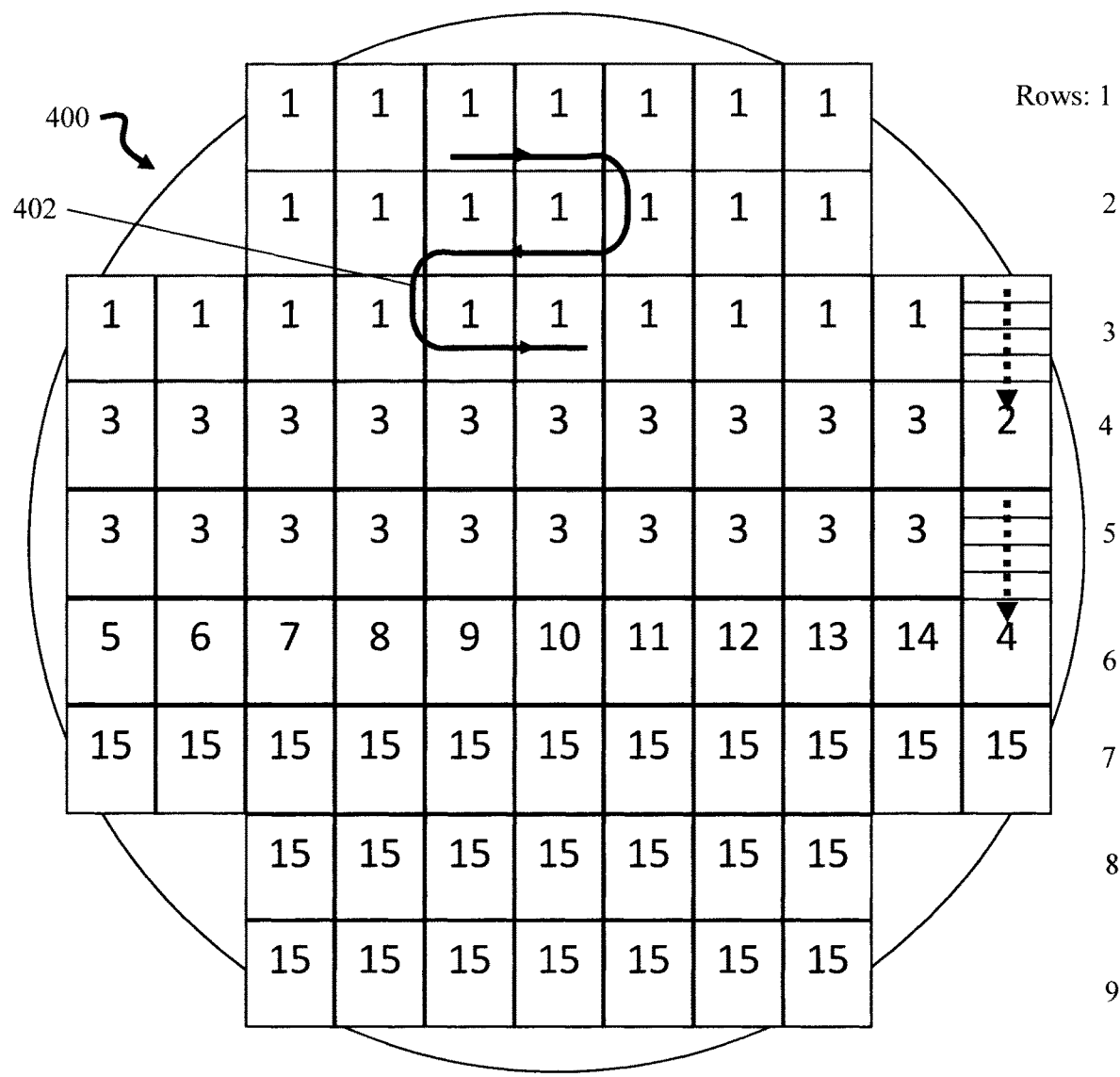
FIG. 4 is a schematic diagram illustrating a sequence of open frame and programmed delay exposures performed across the surface of a wafer according to an embodiment of the present invention.
Figure 5:
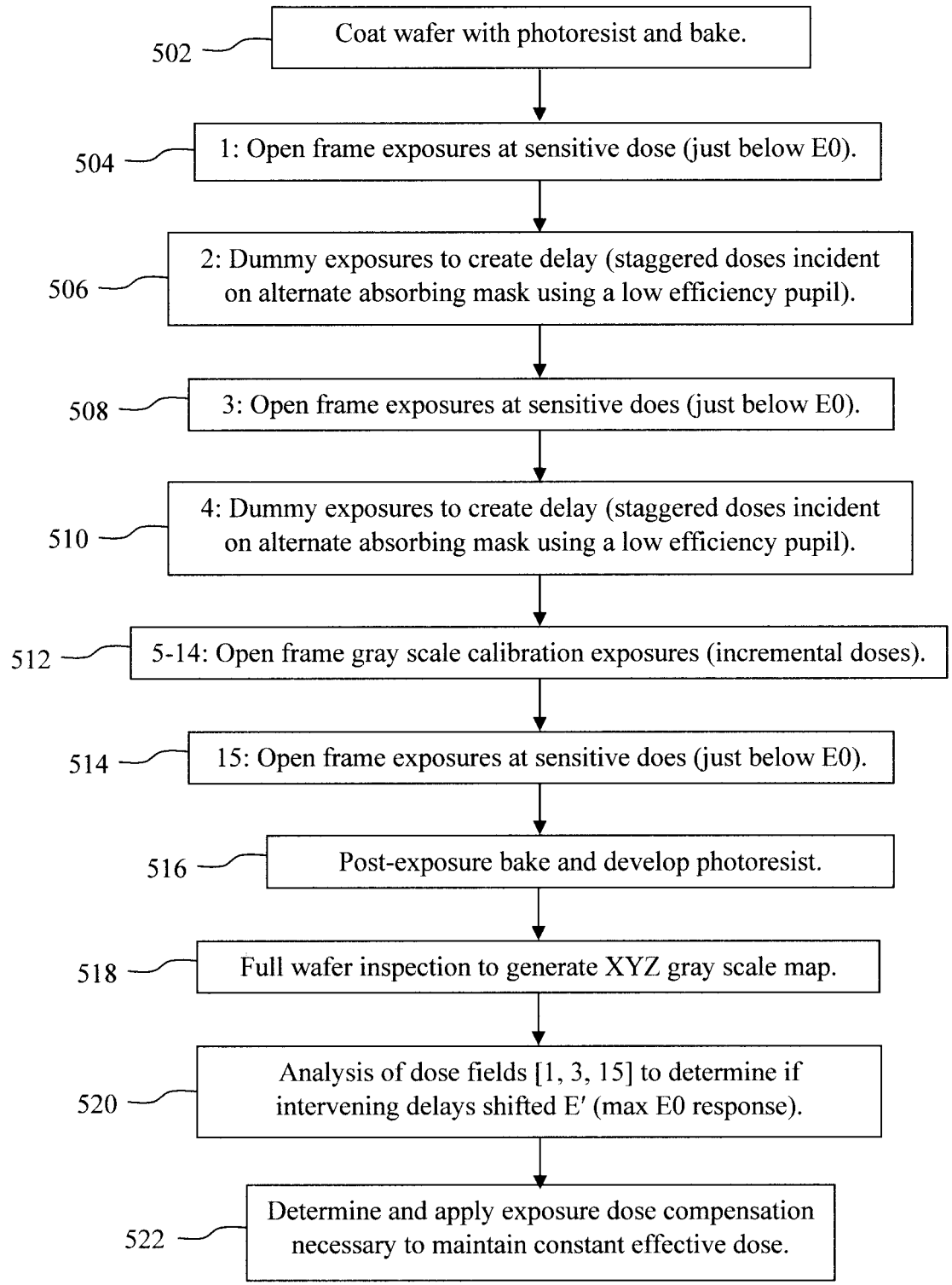
FIG. 5 is a diagram illustrating another exemplary methodology for analyzing a lithography process using programmed delay intervals and use thereof for effective dose compensation according to an embodiment of the present invention.

Given the above overview, an exemplary implementation of the present techniques is now described by way of reference to FIG. 4 and FIG. 5. In this example, the programmed delay intervals will be instituted by swapping an absorbing mask for the open frame mask at the reserved fields. As described above, the absorbing mask reflects approximately 0% of the incident EUV illumination to the wafer surface. Advantageously, use of alternating masks provides a couple of additional minutes of delay simply due to the mask exchanges, i.e., open frame mask→absorbing mask→open frame mask, and only a small percentage (on the order of 1%) of the repeated exposure dose is transmitted by the absorbing mask to the photoresist-coated wafer.

FIG. 4 is a schematic diagram illustrating a sequence of open frame and programmed delay exposures performed across the surface of a wafer 400. A number is assigned to each field of wafer 400, and the scans are performed in the direction indicated by arrow 402. The fields are arranged in a series of rows with a first row at the top of wafer 400 and a last row at the bottom of wafer 400. The numerical value (i.e., 1, 2, 3, . . . 15) provided in each field corresponds to a particular step in methodology 500 of FIG. 5 (see below). Thus, for instance, a sequence of open frame base line exposures at a sensitive dose (1) are performed followed by a programmed delay interval (2) instituted at reserved fields at the right of rows 3 and 4. Another sequence of open frame base line exposures at a sensitive dose (3) are then performed followed by a programmed delay interval (4) instituted at reserved fields at the right of rows 5 and 6, and so on. Open frame exposures at incremental doses (for grayscale calibration) (5-14) are also performed. A final set of open frame base line exposures at a sensitive dose (15) complete the exposure step.

Referring to methodology 500 of FIG. 5, the process begins in step 502 in the same manner as above with a photoresist being applied to the wafer 400 and baked (i.e., via a post-apply bake to drive out residual solvents from the film)—see above. Generally, methodology 500 can be implemented with either a positive photoresist or a negative photoresist.

In step 504, a (first) sequence of open frame base line exposures is performed at a base line dose slightly below E0. As described above, the base line dose provides a sensitive grayscale response, where E0 is the resist dose-to-clear. According to an exemplary embodiment, the base line dose is a dose of from about 92% of the E0 to about 98% of the E0, and ranges therebetween, e.g., a dose of about 0.96×E0 (or 4% below the E0 dose). Further, as described above, the open frame exposures are performed using an open frame mask that reflects approximately 100% of the incident EUV illumination to the surface of wafer 400. Referring to FIG.

4, the open frame base line exposures at the sensitive dose are performed in the (first) set of fields (denoted with a '1') across rows 1-3 of wafer 400.

In step 506, (first) repeated exposures are performed to create a delay interval. According to an exemplary embodiment, the repeated exposures are performed in step 506 by swapping the open frame mask for an absorbing mask in the scanner, and employing staggered doses incident on the absorbing mask using a low efficiency pupil. Referring to FIG. 4, the repeated exposures are performed in the (first) reserved fields (denoted with a '2') between rows 3-4 of wafer 400.

Following the (first) delay interval, in step 508 a (second) sequence of open frame base line exposures is performed at the base line dose, i.e., the dose slightly below E0 that provides a sensitive grayscale response. Referring to FIG. 4, these open frame exposures at the sensitive dose are performed in the (second) set of fields (denoted with a '3') across rows 4-5 of wafer 400.

In step 510, (second) repeated exposures are performed to create another delay interval. According to an exemplary embodiment, these repeated exposures are performed in step 510 by swapping the open frame mask for an absorbing mask in the scanner, and employing staggered doses incident on the absorbing mask using a low efficiency pupil. Referring to FIG. 4, the (second) repeated exposures are performed in the (second) reserved fields (denoted with a '4') between rows 5-6 of wafer 400.

Next, in step 512 a sequence of open frame grayscale calibration exposures (in incremental doses) are performed. According to an exemplary embodiment, each incremental dose step is in 2% increments culminating in the E0 dose, where the E0 dose is the resist dose-to-clear. Referring to FIG. 4, these open frame exposures at incrementing doses are performed in the calibration fields (denoted with a '5'-'14') across row 6 of wafer 400.

Following the calibration exposures, in step 514 a (third) sequence of open frame base line exposures is performed at the base line dose, i.e., the dose slightly below E0 that provides a sensitive grayscale response. Referring to FIG. 4, these open frame exposures at the sensitive dose are performed in the (third) set of fields (denoted with a '15') across rows 7-9 of wafer 400.

As above, in step 516 a post-exposure bake and development of the photoresist is then performed. As described above, developing involves contacting the exposed photoresist with a developing solution to remove either the exposed portions of the photoresist (for a positive photoresist) or the unexposed portion of the photoresist (for a negative photoresist). The programmed delay intervals implemented via the repeated exposures in step 506 and step 510 are designed to intentionally interject expose-to-PEB and PAB-to-expose delays into methodology 500. Namely, these programmed delays intentionally inserted into the process separate the time between when the photoresist-coated wafer is exposed and post-expose bake (step 514-516—described above) and when the post-apply bake and exposure of the photoresist is performed (see step 502-504).

Next, in step 518 a full surface scan of the wafer is performed to generate an XYZ grayscale map. As provided above, this full surface scan of the wafer can be performed using a defect inspection tool that detects and analyzes oblique light scattered from the wafer surface along with the position coordinates (XYZ) of the defects. The signal background noise detected during the defect inspection of the exposed wafer, i.e., haze data, can be converted to the XYZ grayscale map with the surface characteristics of the wafer represented in the grayscale map as shades of gray. The brightness of a given field in the grayscale map correlates to the residual photoresist film properties such as thickness, roughness and surface energy at that field of the wafer, and thus is related to the effective dose received at that point.

In step 520, the XYZ grayscale map is used to determine if the intervening programmed delays had an impact on the base line fields. Namely, according to an exemplary embodiment, in step 520 the base line fields 1, 3 and 15 (see steps 504, 508 and 514, respectively) of the XYZ grayscale map are analyzed to determine if the intervening programmed delays 2 and 4 (see steps 506 and 510) induced a grayscale level change in the respective base line fields 1, 3 and 15. For instance, as provided above, image analysis tools such as MATLAB can be used to analyze the uniformity of the XYZ grayscale map, to determine grayscale level (dose) variations.

If a base line grayscale level offset is detected, then in step 522 the calibration exposures at the incremental doses 5-14 (see step 512) are used to determined what the grayscale values correspond to in dose, i.e., to correlate the grayscale values in the XYZ grayscale map with a particular dose. Based on that information, dose adjustments can be made at the shifted fields with the goal of achieving a constant effective dose across the wafer. For instance, if the intervening programmed delay intervals shift one or more of the open frame base line exposures, then the exposures performed at the incremental doses can be used to correlate the grayscale values in the grayscale map with dose. The dose of the one or more open frame base line exposures shifted by the intervening programmed delay intervals can be adjusted accordingly to achieve a constant effective dose across the wafer. Once a correlation is made between delay time and effective dose correction required for a given photoresist process the appropriate scanner dose compensation can be applied to product wafers by using small exposure dose meander steps.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 6:
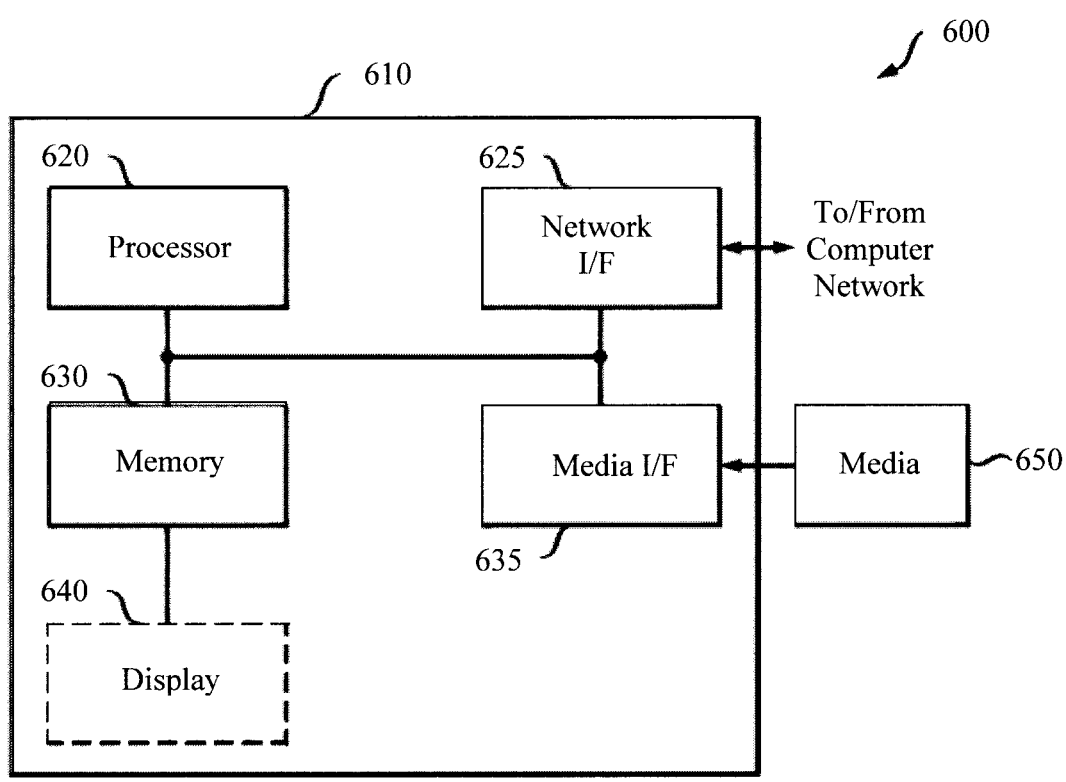
FIG. 6 is a diagram illustrating an exemplary apparatus for performing one or more of the methodologies presented herein according to an embodiment of the present invention.

Turning now to FIG. 6, a block diagram is shown of an apparatus 600 for implementing one or more of the methodologies presented herein. By way of example only, apparatus 600 can be configured to implement one or more of the steps of methodology 200 of FIG. 2 and/or one or more of the steps of methodology 500 of FIG. 5. For instance, by way of example only, EUV scanner 100 (see FIG. 1) for performing the sequences of open frame base line exposures with intervening programmed delay intervals and/or the defect inspection tool for XYZ grayscale mapping can be controlled by apparatus 600. Further, apparatus 600 can process data received from the XYZ grayscale map to determine if the intervening programmed delays had an impact on the base line fields and, if so, what dose compensations are needed to maintain a constant effective dose.

Apparatus 600 includes a computer system 610 and removable media 650. Computer system 610 includes a processor device 620, a network interface 625, a memory 630, a media interface 635 and an optional display 640. Network interface 625 allows computer system 610 to connect to a network, while media interface 635 allows computer system 610 to interact with media, such as a hard drive or removable media 650.

Processor device 620 can be configured to implement the methods, steps, and functions disclosed herein. The memory 630 could be distributed or local and the processor device 620 could be distributed or singular. The memory 630 could be implemented as an electrical, magnetic or optical memory, or any combination of these or other types of storage devices. Moreover, the term "memory" should be construed broadly enough to encompass any information able to be read from, or written to, an address in the addressable space accessed by processor device 620. With this definition, information on a network, accessible through network interface 625, is still within memory 630 because the processor device 620 can retrieve the information from the network. It should be noted that each distributed processor that makes up processor device 620 generally contains its own addressable memory space. It should also be noted that some or all of computer system 610 can be incorporated into an application-specific or general-use integrated circuit.

Optional display 640 is any type of display suitable for interacting with a human user of apparatus 600. Generally, display 640 is a computer monitor or other similar display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of analyzing a lithography process, the method comprising the steps of:
    applying a photoresist to a wafer;
    performing a post-apply bake of the photoresist;
    patterning the photoresist with sequences of open frame base line exposures performed at doses of from about 92% E0 to about 98% E0, and ranges therebetween, at multiple sets of fields of the wafer separated by intervening programmed delay intervals, wherein E0 is the photoresist dose-to-clear;
    performing a post-exposure bake of the photoresist;
    developing the photoresist;
    performing a full wafer inspection to generate a grayscale map of the wafer; and
    analyzing the grayscale map to determine whether the intervening programmed delay intervals had an effect on the open frame base line exposures during the lithography process.

2. The method of claim 1, further comprising the step of:
    patterning the photoresist with a sequence of open frame calibration exposures performed at incremental dose steps.

3. The method of claim 2, wherein the incremental dose steps are in 2% increments culminating in E0.

4. The method of claim 2, wherein the intervening programmed delay intervals shift one or more of the open frame base line exposures, the method further comprising the steps of:
    using the open frame calibration exposures performed at the incremental doses to correlate grayscale values in the grayscale map with dose;
    adjusting the dose of the one or more open frame base line exposures shifted by the intervening programmed delay intervals to achieve a constant effective dose across the wafer; and
    using a delay-dose shift correlation to devise a dose compensation to apply to product wafers.

5. The method of claim 1, wherein the open frame base line exposures are performed at a dose of about 0.96×E0.

6. The method of claim 1, wherein the intervening programmed delay intervals are performed at reserved fields of the wafer.

7. The method of claim 6, wherein the patterning is performed using an extreme ultraviolet (EUV) scanner having an open frame mask for the open frame base line exposures, the method further comprising the step of:
    exchanging the open frame mask for an absorbing mask for the intervening programmed delay intervals performed at the reserved fields of the wafer.

8. The method of claim 7, wherein the open frame mask reflects approximately 100% of incident EUV illumination to a surface of the wafer.

9. The method of claim 7, wherein the absorbing mask reflects approximately 0% of incident EUV illumination to a surface of the wafer.

10. The method of claim 1, further comprising the steps of:
    patterning the photoresist with a first sequence of open frame base line exposures performed at a first set of fields of the wafer;
    patterning the photoresist with first intervening programmed delay intervals performed at first reserved fields of the wafer;
    patterning the photoresist with a second sequence of open frame base line exposures performed at a second set of fields of the wafer;
    patterning the photoresist with second intervening programmed delay intervals performed at second reserved fields of the wafer;
    patterning the photoresist with a sequence of open frame calibration exposures performed at incremental doses at calibration fields of the wafer; and
    patterning the photoresist with a third sequence of open frame base line exposures performed at a third set of fields of the wafer.

11. A method of analyzing a lithography process, the method comprising the steps of:
    applying a photoresist to a wafer;
    performing a post-apply bake of the photoresist;
    patterning the photoresist with sequences of open frame base line exposures performed at doses of from about 92% E0 to about 98% E0, and ranges therebetween, at multiple sets of fields of the wafer separated by intervening programmed delay intervals performed at reserved fields of the wafer, and a sequence of open frame calibration exposures performed at incremental dose steps at calibration fields of the wafer, wherein E0 is the photoresist dose-to-clear;
    performing a post-exposure bake of the photoresist;
    developing the photoresist;
    performing a full wafer inspection to generate a grayscale map of the wafer;
    analyzing the grayscale map to determine whether the intervening programmed delay intervals had an effect on the open frame base line exposures during the lithography process;
    using the open frame calibration exposures performed at the incremental doses to correlate grayscale values in the grayscale map with dose for those open frame base line exposures shifted by the intervening programmed delay intervals;
    adjusting the dose of the base line exposures shifted by the intervening programmed delay intervals to achieve a constant effective dose across the wafer; and
    using a delay-dose shift correlation to devise a dose compensation to apply to product wafers.

12. The method of claim 11, wherein the open frame base line exposures are performed at a dose of about 0.96×E0.

13. The method of claim 11, wherein the incremental dose steps are in 2% increments culminating in E0.

14. The method of claim 11, wherein the patterning is performed using an EUV scanner having an open frame mask for the open frame base line exposures, the method further comprising the step of:

exchanging the open frame mask for an absorbing mask for the intervening programmed delay intervals performed at the reserved fields of the wafer.

15. The method of claim 14, wherein the open frame mask reflects approximately 100% of incident EUV illumination to a surface of the wafer.

16. The method of claim 14, wherein the absorbing mask reflects approximately 0% of incident EUV illumination to a surface of the wafer.

17. The method of claim 11, further comprising the steps of:
patterning the photoresist with a first sequence of open frame base line exposures performed at a first set of fields of the wafer;
patterning the photoresist with first intervening programmed delay intervals performed at first reserved fields of the wafer;
patterning the photoresist with a second sequence of open frame base line exposures performed at a second set of fields of the wafer;
patterning the photoresist with second intervening programmed delay intervals performed at second reserved fields of the wafer;
patterning the photoresist with a sequence of open frame calibration exposures performed at incremental doses at calibration fields of the wafer; and
patterning the photoresist with a third sequence of open frame base line exposures performed at a third set of fields of the wafer.

18. A computer program product for analyzing a lithography process, the computer program product comprising a computer readable storage medium having program instructions embodied therewith, the program instructions executable by a computer to cause the computer to:
pattern a photoresist, which has been applied to a wafer and a post-apply bake of the photoresist has been performed, with sequences of open frame base line exposures performed at doses of from about 92% E0 to about 98% E0, and ranges therebetween, at multiple sets of fields of the wafer separated by intervening programmed delay intervals, and a sequence of open frame calibration exposures performed at incremental dose steps at calibration fields of the wafer, wherein E0 is the photoresist dose-to-clear;
perform a full wafer inspection, after a post-exposure bake of the photoresist has been performed and the photoresist has been developed, to generate a grayscale map of the wafer;
analyze the grayscale map to determine whether the intervening programmed delay intervals had an effect on the open frame base line exposures during the lithography process;
use the open frame calibration exposures performed at the incremental doses to correlate grayscale values in the grayscale map with dose for those open frame base line exposures shifted by the intervening programmed delay intervals;
adjust the dose of the base line exposures shifted by the intervening programmed delay intervals to achieve a constant effective dose across the wafer; and
use a delay-dose shift correlation to devise a dose compensation to apply to product wafers.

19. The computer program product of claim 18, wherein the open frame base line exposures are performed at a dose of about 0.96×E0, wherein each of the incremental dose steps are in 2% increments culminating in E0.

20. The computer program product of claim 18, wherein the program instructions further cause the computer to:
pattern the photoresist with a first sequence of open frame base line exposures performed at a first set of fields of the wafer;
pattern the photoresist with first intervening programmed delay intervals performed at first reserved fields of the wafer;
pattern the photoresist with a second sequence of open frame base line exposures performed at a second set of fields of the wafer;
pattern the photoresist with second intervening programmed delay intervals performed at second reserved fields of the wafer;
pattern the photoresist with a sequence of open frame calibration exposures performed at incremental doses at calibration fields of the wafer; and
pattern the photoresist with a third sequence of open frame base line exposures performed at a third set of fields of the wafer.

* * * * *